United States Patent
Spijker et al.

(10) Patent No.: US 7,369,002 B2
(45) Date of Patent: May 6, 2008

(54) PHASE LOCKED LOOP FAST LOCK METHOD

(75) Inventors: Menno Tjeerd Spijker, Ottawa (CA); Jason Robert Rosinski, Jr., Ottawa (CA); Robertus Laurentius Van Der Valk, Capelle a/d IJssel (NL)

(73) Assignee: Zarlink Semiconductor, Inc., Kanata (CA)

( * ) Notice: Subject to any disclaimer, the term of this patent is extended or adjusted under 35 U.S.C. 154(b) by 36 days.

(21) Appl. No.: 11/460,393

(22) Filed: Jul. 27, 2006

(65) Prior Publication Data

US 2007/0024383 A1    Feb. 1, 2007

Related U.S. Application Data

(60) Provisional application No. 60/703,285, filed on Jul. 28, 2005.

(51) Int. Cl.
*H03L 7/095* (2006.01)
*H03L 7/10* (2006.01)
*H03L 7/113* (2006.01)

(52) U.S. Cl. .................. 331/17; 331/25; 331/DIG. 2

(58) Field of Classification Search .......... 331/14, 331/16, 17, 18, 25, DIG. 2; 327/156–159; 332/127; 360/51; 375/376; 455/260
See application file for complete search history.

(56) References Cited

U.S. PATENT DOCUMENTS

| | | | |
|---|---|---|---|
| 4,574,243 A | 3/1986 | Levine | |
| 4,574,254 A | 3/1986 | Glance | |
| 4,866,404 A | 9/1989 | Vandegraaf | |
| 5,334,952 A | 8/1994 | Maddy et al. | |
| 5,400,034 A | 3/1995 | Smith | |
| 5,498,998 A | 3/1996 | Gehrke et al. | |
| 5,534,823 A | 7/1996 | Kondou | |
| 5,610,558 A | 3/1997 | Mittel et al. | |
| 5,656,975 A | 8/1997 | Imura | |
| 5,686,866 A | 11/1997 | Badger | |
| 5,764,300 A | 6/1998 | Badger | |
| 6,144,708 A | 11/2000 | Maruyama | |
| 6,424,230 B1 | 7/2002 | Kocaman et al. | |
| 6,597,754 B1 | 7/2003 | Janesch et al. | |
| 6,643,346 B1 | 11/2003 | Pedrotti et al. | |
| 6,693,494 B2 * | 2/2004 | Fan | 331/17 |
| 6,765,445 B2 | 7/2004 | Perrott et al. | |
| 6,784,706 B2 | 8/2004 | Van Der Valk et al. | |
| 6,828,864 B2 | 12/2004 | Maxim et al. | |
| 6,864,753 B2 | 3/2005 | Lee et al. | |
| 6,998,923 B2 | 2/2006 | Melanson | |
| 2004/0032842 A1 | 2/2004 | Mesecher et al. | |
| 2004/0066845 A1 | 4/2004 | Leith et al. | |
| 2005/0111605 A1 | 5/2005 | Loke et al. | |

* cited by examiner

*Primary Examiner*—David Mis
(74) *Attorney, Agent, or Firm*—Lawrence E. Laubscher, Jr.

(57) ABSTRACT

The present invention is a method to rapidly lock a type II phase locked loop (PLL) after a frequency jump without degrading the output signal much. The method to decrease the settling time and improve the quality of the output clock during the settling disclosed herein comprises of the following broad steps: Estimate new frequency offset with a separate circuit outside the PLL loop to measure the frequency of the input signal accurately. Ramp integrator to the new frequency offset. Do phase build out or phase pull-in. The remaining phase offset is build out when no edge to edge alignment is required. Otherwise, the remaining phase offset is pulled in while the integrator in the PLL's loop filter is disabled. Reduce the PLL bandwidth and/or lower damping to let the PLL settle. Switch the PLL to final bandwidth and damping required by the application.

16 Claims, 6 Drawing Sheets

PHASE LOCKED LOOP FAST LOCK METHOD

CROSS-REFERENCE TO RELATED APPLICATION

This application claims the benefit of U.S. Provisional Application No. 60/703,285 filed Jul. 28, 2005, incorporated by reference herein.

FIELD OF THE INVENTION

The invention relates to phase locked loops and in particular a method to achieve lock in a relatively short time.

BACKGROUND OF THE INVENTION

One of the. characteristics of a phase locked loop (PLL) is the locking or settling time; i.e. the time it takes the PLL to lock to a certain input signal or to respond to frequency and phase steps. In general, the locking time is dependent on the PLL's loop bandwidth, the lower the loop bandwidth the longer it takes the PLL to lock. It is generally accepted in the art that the term "settle" is defined as arriving within a certain relative or absolute accuracy.

PLLs are not only used in telecommunications applications, but also in measurement technology (for instance optical telemetry), control of motors, medical equipment and the like. Also in those applications, the phase and frequency step responses are important design considerations.

One of the most widely used types of PLL is the type II PLL. A type II PLL will lock with zero frequency offset and zero phase offset while a type I PLL will only achieve zero frequency offset when in lock.

FIG. 1 shows a typical type II PLL, consisting of a phase detector, a loop filter, a controlled oscillator and a feedback loop with a divider. In FIG. 1, a phase detector 10 is connected to a pair of multipliers 12, 18. The multiplier 12 is connected to the input of a controlled oscillator 16, for example a digital controlled oscillator. The loop filter of a type II PLL has an integrator 20 to achieve the zero phase offset when the PLL is in lock. The output of the multiplier 18 is connected to the integrator 20. The multipliers introduce the P factor and the I factor in a manner known per se. A feedback loop is provided from the output of the controlled oscillator 16 through proportional unit 30 to the second input of the phase detector 10.

When the PLL is locking to the input signal, the phase detector's output signal is integrated in the loop filter's integrator and the integrator's output signal is combined with the phase detector's output signal to the control signal of the controlled oscillator. The path from the phase detector to adder where the integrator value is added is often called the proportional path. The integrating path and the proportional path have separate scaling factors. The proportional path factor mainly determines the loop filter bandwidth while the ratio of proportional path and the integrating path factor determines the damping of the PLL.

The use of I and P factors are known in the art and control the performance of the PLL. The output of the integrator is added to the output of the phase detector multiplied by the P factor to determine the frequency of the controlled oscillator. When the phase difference is zero, i.e. on a phase hit, the frequency of the controlled oscillator is determined by the output of the integrator.

When the type II PLL is locked with a zero phase offset, the phase detector generates a zero output value. If the PLL's input signal has a frequency offset with respect to the PLL's centre frequency, then the integrator in the loop filter must generate the control signal that offsets the controlled oscillator from the PLL's centre frequency. So when the type II PLL is locked, the integrator in the loop filter contains the frequency offset.

The ratio of the proportional and integrator path factors determines the damping and thereby the response of the PLL with respect to phase and frequency transients. If the PLL has a small damping i.e. is underdamped, the integrating path factor is relatively large, it will respond to input transients with large overshoots in the time domain and it will show peaking in the jitter transfer function in the frequency domain. If the PLL has a large damping i.e. is overdamped, the integrating path factor is relatively small, it will respond to input transients with no or barely any overshoot in the time domain and has practically no peaking in the frequency domain jitter transfer function.

The amount of overshoot and peaking that can be tolerated is usually determined by the application. In many applications, relatively large overshoot and peaking is simply not acceptable. In the case of PLL's for telecommunications applications, telecom standards define how much peaking is allowed, for example 2% or 0.2 dB. These numbers are quite small.

When a frequency step is applied to a type II PLL, the damping determines how fast the integrator in the loop filter will settle to the value corresponding to the new frequency offset. The larger the damping, the longer the settling time of the integrator and thereby the longer it takes the PLL to achieve lock. U.S. Pat. No. 6,784,706 to Van Der Valk issued on Aug. 31, 2004 describes the relationship between the locking time, the bandwidth and the damping for type II PLLs. From this analysis follows that PLL's with a low bandwidth and a damping that limits the peaking to 0.2 dB take a long time to lock if no special measures are taken.

Various telecom standards restrict the maximum locking time of PLL with a very low bandwidth. For example Telcordia GR-1244-CORE states that the locking time of a Sonet Minimum Clock (SMC) compliant PLL with a bandwidth of 0.1 Hz must be locked within 100 seconds. A Stratum 3E compliant PLL with a bandwidth of 1 mHz must be locked within 700 seconds. These numbers cannot be met without special measures like temporarily increasing the bandwidth, decreasing the damping or both.

A common method to decrease the locking time is to temporarily increase the PLL's bandwidth and decrease the damping. Several PLL circuits for telecom applications use this approach. The disadvantage of increasing the PLL's bandwidth is that more phase noise that may be present on the input signal is not attenuated as much before propagating to the output of the PLL. Decreasing the damping of the PLL will cause a larger overshoot on the output signal. These effects degrade the quality of the output signal or may even cause disruptions in the network and are therefore undesirable.

The method disclosed in U.S. Pat. No. 6,784,706 monitors the phase offset during the locking process. When the phase offset is zero just before the PLL's output clock frequency overshoots the target frequency, the proportional value is added to the integrator and in principle the PLL is (close to) lock. However, this method is sensitive to wander and jitter on the input reference clock and can therefore copy a relatively large frequency error to the integrator.

Phase noise (wander and jitter) on the measured reference can degrade the accuracy of the measured frequency offset. If the PLL uses the same local oscillator clock to generate its output clock, the accuracy of the local clock is a common mode error for both the reference monitor's frequency estimate and the PLL's frequency offset.

In FIG. 7 the line represents the normal phase response, which shows some overshoot and thus carries quite a lot of settling.

SUMMARY OF THE INVENTION

The present invention is a method to rapidly lock a type II phase locked loop (PLL) after a frequencyjump without degrading the output signal much. The method disclosed here was developed for digital PLLs in telecommunications applications but it can be applied to other applications and implementations as well.

The method to decrease the settling time and improve the quality of the output clock during the settling in accordance, with the teachings of this invention comprises of the following broad steps:

1) Estimate new frequency offset. This is done with a separate circuit outside the PLL loop to measure the frequency of the input signal accurately. This function is often already provided as an input signal monitoring circuit.

2) Ramp integrator to the new frequency offset. The integrator in the loop filter makes a linear ramp to the measured new frequency after the jump.

3) Do phase build out or phase pull-in. The remaining phase offset is build out when no edge to edge alignment is required. Otherwise, the remaining phase offset is pulled in while the integrator in the PLL's loop filter is disabled.

4) Reduce the PLL bandwidth and/or lower damping to let the PLL settle.

5) Switch the PLL to final bandwidth and damping required by the application.

Thus, according to one aspect, the invention provides a method of locking a phase lock loop (PLL) after a lock lost is detected, comprising estimating a new frequency offset using a circuit separate from the PLL; integrator ramping to the new frequency offset; adjusting the phase of the PLL based on the new frequency offset; and decaying the PLL to settle to the frequency jump.

In another aspect, the invention provides a method of locking a phase lock loop (PLL) after a lock lost is detected, comprising estimating a new frequency offset using a circuit separate from the PLL; integrator ramping to the new frequency offset; adjusting the phase of the PLL based on the new frequency offset by performing phase build out if a zero phase offset is not required, or performing a phase pull in if a zero phase is required; and decaying the PLL to settle to the frequency jump by relaxing the bandwidth and/or damping of the PLL Advantages of a method in accordance with the teachings of this invention over traditional methods are:

Relatively short locking time: 45 s for a SONET Minimum Clocks (SMC) compliant PLL using the disclosed method versus 95 s for a prior art PLL under the same circumstances.

No excessive noise from the network is passed on to the output during the fast lock procedure due to a much wider PLL bandwidth as is the case with traditional fast lock methods. No significant frequency—or phase overshoot of the output clock during fast lock. Therefore the output clocks remain compliant with the applicable network standards during fast lock.

The phase change rate and frequency change rate can be controlled accurately and kept within the limits of the various network standards. For example a maximum frequency change rate of 2.9 ppm/s as specified by Telcordia GR-1244-CORE for a Stratum 2/3/3E clock.

Since the frequency estimation is not done by the PLL itself, active input reference clocks can be monitored continuously and an accurate frequency estimate is available when needed. So there is no additional acquisition time added to the fast lock time.

Other aspects and advantages of embodiments of the invention will be readily apparent to those ordinarily skilled in the art upon a review of the following description.

BRIEF DESCRIPTION OF THE DRAWINGS

Embodiments of the invention will now be described in conjunction with the accompanying drawings, wherein.

This invention will now be described in detail with respect to certain specific representative embodiments thereof, the materials, apparatus and process steps being understood as examples that are intended to be illustrative only. In particular, the invention is not intended to be limited to the methods, materials, conditions, process parameters, apparatus and the like specifically recited herein.

DETAILED DESCRIPTION OF THE DISCLOSED EMBODIMENTS

Broadly, the method to decrease the settling time and improve the quality of the output clock during the settling disclosed in this patent comprises of the following steps: estimate the new frequency offset, integrator ramp to the new frequency offset, phase build-out or phase pull-in, decay interval, and switch to higher bandwidth and/or lower damping to let the PLL settle.

Figure 4:
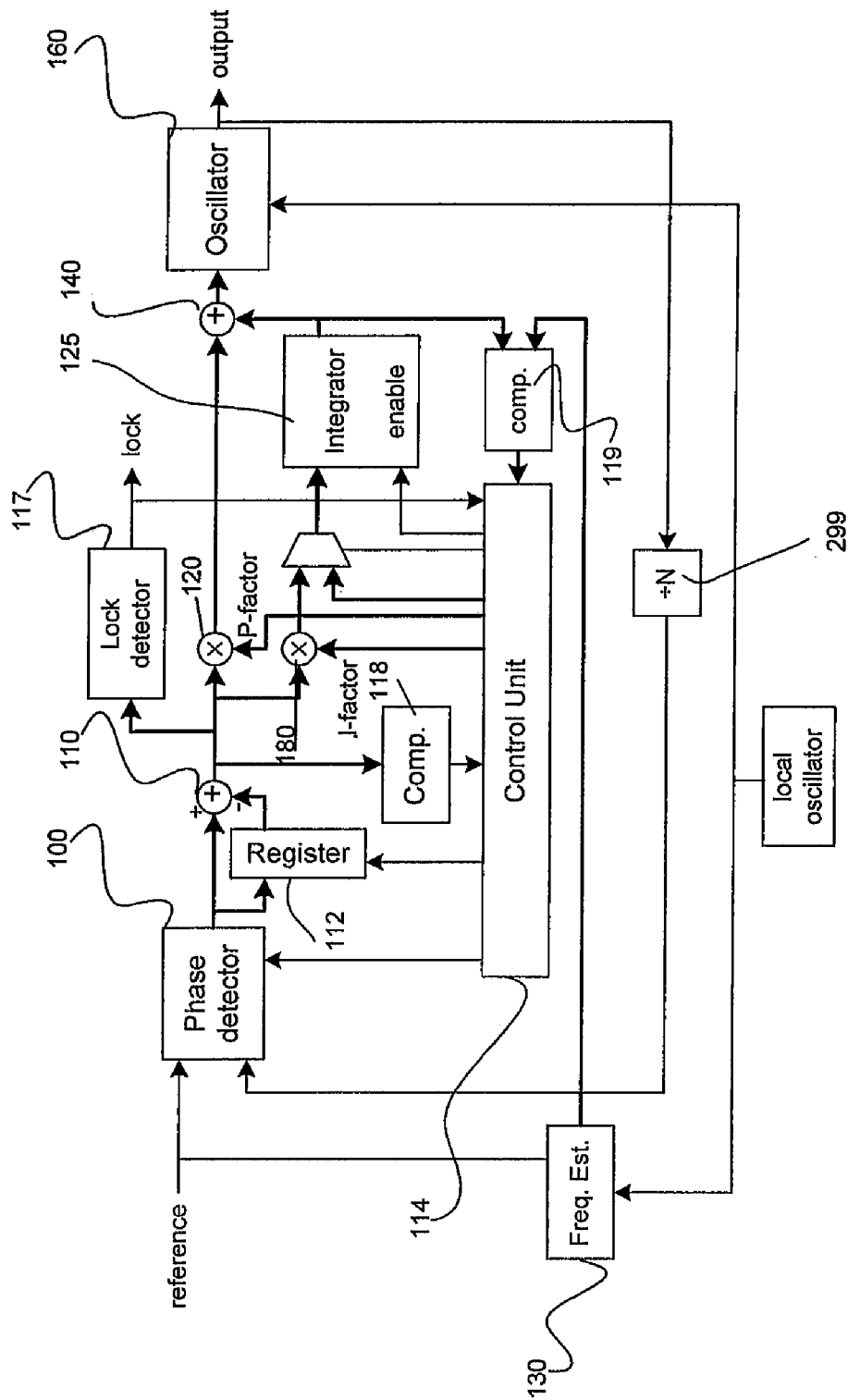
FIG. 4 is a block diagram of a first embodiment of a PLL according to the teachings of the invention.

FIG. 4 illustrates a PLL in accordance with teachings of this invention. A phase and frequency detector 100 outputs to an adder 110 and also to register 112, which is controlled by control unit 114. The output of register 112 is connected to adder 110. The register 112 is a preferred embodiment of a phase build out circuit as described in detail below. The output of adder 110 is. connected to comparator 118. The output of adder 110 is also connected to a pair of multipliers 120, 180, introducing the P and I factors respectively. The multiplier 120 is connected to the first input of adder 140 whose output is connected to the first input of a controlled oscillator 160. The controlled oscillator could be any kind of suitable oscillator, such as a voltage controlled, current controlled or digital controlled oscillator. In this example, the controlled oscillator is a digital controlled oscillator.

The frequency estimator 130 is a separate circuit that provides its output to the integrator 125 of the loop filter of the PLL.

The output of multiplier 180 is connected to integrator 125. The integrator 125 in the loop may be a sampled integrator, a summator or accumulator. The output of integrator 125 is connected to the second input of adder 140.

A feedback loop is provided from the output of the controlled oscillator 160 through proportional unit 299 to the second input of the phase detector 100.

The difference between the frequency estimator 130 and the integrator 125 is monitored by a comparator 119 and signals to the control circuit 114 when the integrator 125 has reached the value of the frequency estimator 130.

A register 112 at the output of the phase detector 100 can contain a phase offset that will be maintained when a zero phase offset is not required by the PLL.

Another comparator 118 monitors the phase output of the phase detector 100 minus the phase offset in the register 112.

A lock detector 117 also monitors the phase output of the phase detector 100 minus the phase offset to determine whether the PLL is locked.

Figure 5:
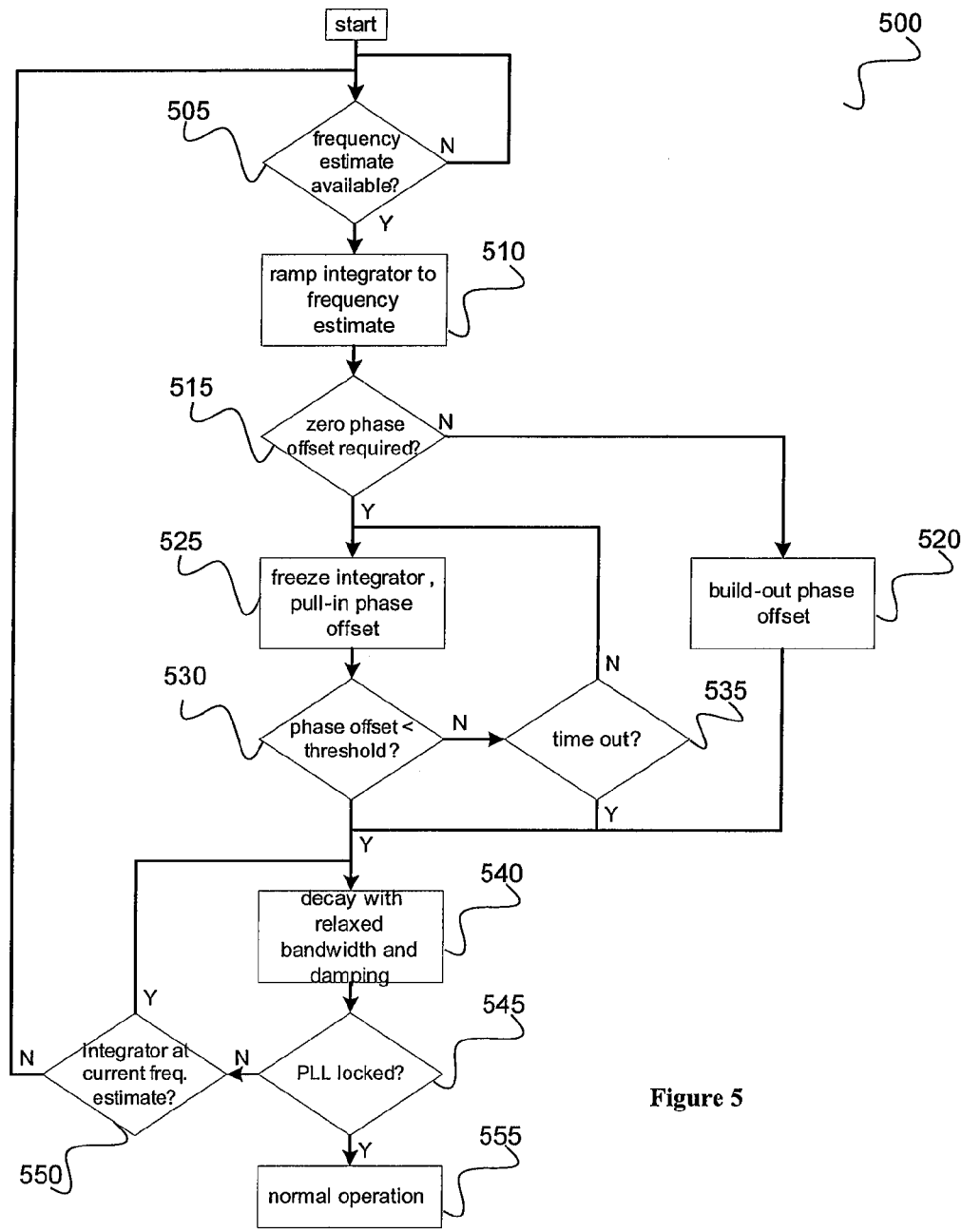
FIG. 5 shows a flow diagram of the disclosed fast lock method in accordance with the teachings of this invention.

Broadly speaking, the operation of the circuit follows. The process is illustrated in the flow diagram of FIG. 5.

The detection of lock lost by lock detector 117 initiates the method 500 of fast locking the PLL in accordance with the teachings of this invention.

First in step 505 a frequency estimation must be available. The PLL continues to loop around this step until an estimation is available. The estimation is provided by an external circuit 130 as detailed below. When a frequency estimate is available, the integrator 125 linearly ramps to the frequency in step 510.

The application determines if a zero phase offset is required in step 515. The user provides this setting to the device. If a zero phase offset is not required, the phase is build out in step 520, as described in detail below. If so, then the integrator 125 is frozen and the phase is pulled in step 525. If the phase is pulled in, then it must be determined by the application if the phase offset it less than a predetermined threshold in step 530 and if the pull-in time does not exceed a time out of, for example 1 s, in step 535. These numbers are dependent on the PLL characteristics such as the loop filter bandwidth and the tolerable wander/jitter on the input clock.

Once the phase is adjusted either by pulling in or building out, the bandwidth and damping of the PLL are relaxed to permit the PLL to stabilize in step 540. If after a certain length of time the PLL has not stabilized in step 545, it is determined whether or not the integrator is still at the estimated frequency in step 550. If it is, the decay step continues. However, if not, then the method is re-initiated. Once the PLL has stabilized, normal operation resumes until initiation of the method again in step 555.

Frequency Estimation

Figure 1:
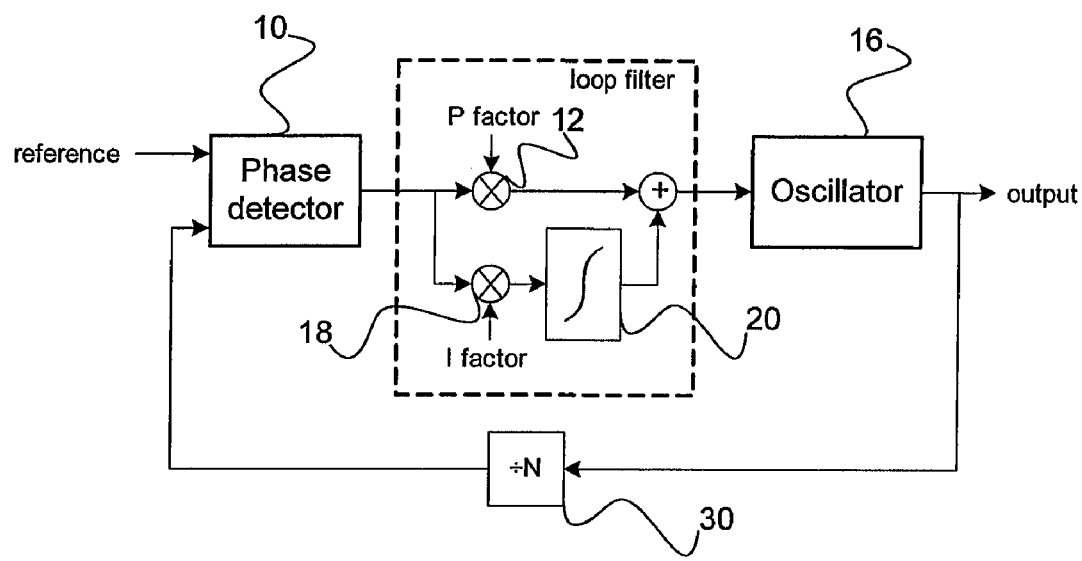
FIG. 1 illustrates a block diagram of a typical type II PLL.
Figure 2:
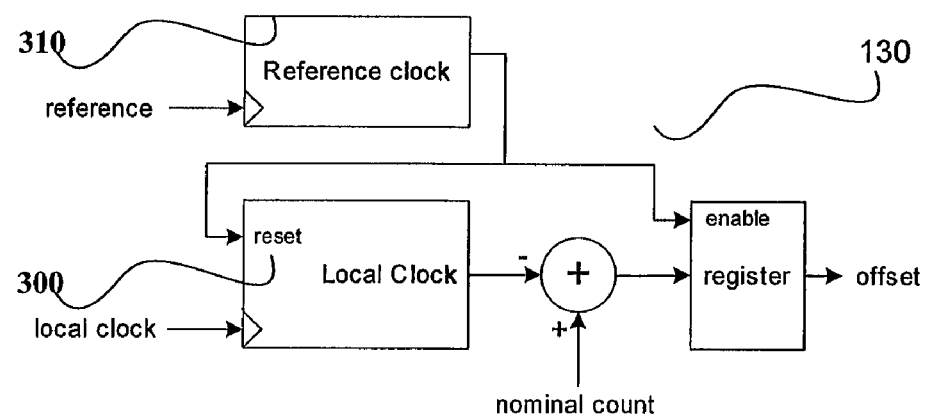
FIG. 2 shows a frequency estimator with the use of counters that can be used as a frequency estimator in one embodiment of the invention.
Figure 3:
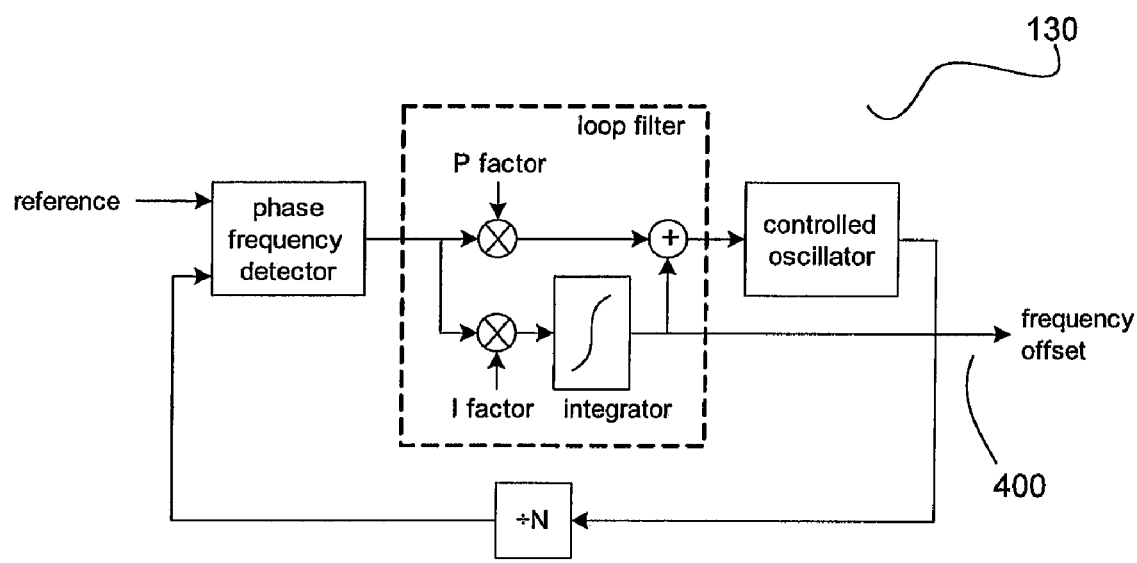
FIG. 3 shows an acquisition PLL that can be used as a frequency estimator in another embodiment of the invention.

The frequency estimation is determined using a separate circuit 130. The separate circuit may be an input signal monitoring circuit already provided in the system. Such a system in a simple form is illustrated in FIG. 2 where a local clock cycle counter 300 counts the number of local clock cycles during a predetermined number of reference clock 310 cycles. Typically, the predetermined number of reference clock cycles would equal about 10 s. Another more advanced option for a frequency estimation circuit is a second type II PLL which provides an additional output of frequency 400 to the PLL of FIG. 4. Such a system is illustrated in FIG. 3.

In PLL devices for telecommunications applications, the PLL's input reference clock is usually monitored to establish the quality of the clock. One of the quality criteria is the frequency offset from the nominal frequency. Most telecommunication standards specify the maximum frequency offset that is allowed in the network. If the PLL's input reference clock has an offset that is larger than what is tolerable, the PLL must not use that clock as an input reference. So before the PLL can use a clock as its input reference clock, the frequency offset must be known and within the limits of the applicable standard. This knowledge can be used to let the PLL settle to the frequency of the reference input clock faster.

There are various methods possible to determine the frequency offset or the exact frequency of the selected input reference clock. The simplest method is to use a counter that is running on a local clock with a known frequency. This counter measures the number of local clock cycles within an interval of a defined number of reference clock cycles. From that number, the frequency offset between the local oscillator clock and the reference can be calculated with a high accuracy.

Some telecommunication standards define the measurement interval to be at least 10 s. If the local oscillator clock is for example 20 MHz, that would in theory give an accuracy of:

$$\frac{\frac{1}{20 \text{ MHz}}}{10 \text{ s}} = \frac{50 \text{ ns}}{10 \text{ s}} = 5 \cdot 10^{-9}$$

Other, more advanced methods of determining the frequency offset of the PLL can include some phase noise filtering to increase the accuracy of the measured frequency offset. For example, an additional acquisition PLL with a wider bandwidth than the main PLL can be used to settle quickly to the input reference clock. When the acquisition PLL is settled say after 10 s, the integrator of that acquisition PLL would contain the frequency offset value. The acquisition PLL filters out some of the phase noise and thereby can achieve better accuracy. This all depends on the bandwidth and damping of the acquisition PLL. If the acquisition PLL has the same bandwidth and damping as the main PLL, the frequency measurement will have the same accuracy as the main PLL will achieve and therefore the main PLL can skip the decay stage in the locking method. However this setup is worthwhile for reference switching when the new reference can be monitored for sufficient time before the switchover.

Integrator Ramp

Once the frequency offset of the input reference clock is known, the integrator 125 in the PLL's loop filter makes a ramp to that frequency offset. The rate at which the integrator ramps to the new frequency offset is constant and set to the maximum rate that is still compatible with the requirements of the application. For example, the Telcordia GR-1244-CORE standard specifies a maximum fractional frequency change of 2.9 ppm/s for Stratum 2, 3 and 3E clocks. The integrator integrates a constant positive or negative value, dependent on the integrators starting point and the end frequency offset from the frequency estimator. At the end of the integrator ramping, the integrator is at the same frequency offset as the frequency estimator measured. During the integrator ramp, the phase detector is disabled and the controlled oscillator is only controlled by the integrator value.

The main advantage of doing a linear ramp is that there will be no significant overshoot in the PLL's output frequency. The frequency overshoot is determined by the accuracy of the frequency estimation. Due to wander and jitter on the input reference clock, the accuracy of the frequency estimation can degrade.

Another advantage is that the rate at which the integrator and thereby the output frequency changes can be set easily and accurately compliant with the application. For example, Telcordia GR-1244-CORE specifies a maximum frequency change during pull-in of 2.9 ppm/s for Stratum 2, 3E or 3 clocks.

Phase Build Out or Phase Pull In

After the integrator ramp, the PLLs output frequency is (almost) the same as the frequency of the input reference clock. However, there will likely be a phase offset between the input reference clock and the PLL's output clock. In some applications, there is no need for edge to edge alignment of the PLL's output clock and the input reference clock and it is preferable to minimize the phase movement of the output clock. In that case, a phase build out is performed and the phase offset is compensated in the PLL loop. This also reduces the lock time, as a phase pull-in can be slow due to a maximum phase slope limit imposed by the applicable network standard or a low bandwidth of the PLL.

FIG. 4 shows how the phase build out is done in a preferred embodiment. The phase detector 100 is reset first and then measures the shortest phase offset between the input reference clock and the PLL's feedback clock. This value is stored in a register 112 and subtracted from the phase values from the phase detector.

In applications where an edge to edge alignment between the PLL's output clock and the input reference clock is required, the phase build out stage is omitted. Instead, the phase offset remaining after the frequency ramp is pulled in. If the phase offset is significant, the integrator would also see a large phase value from the phase detector that it would integrate, thereby disturbing the frequency offset achieved with the frequency ramp. To avoid that, the integrator is disabled during the phase pull-in and is enabled again when the phase pull-in is completed. The completion of the phase pull-in can easily be detected by monitoring the phase values from the phase detector. If the absolute phase value drops below a certain threshold, the phase pull-in is completed. The threshold is necessary as the phase values may jump over the zero value due to phase noise on the input reference. To prevent that the integrator remains disabled due to a frequency drift and therefore the absolute phase value does not drop below the threshold, there is a time-out timer that re-enables the integrator after a certain time regardless of the absolute phase value from the phase detector. During the phase pull-in, the phase alignment speed can be limited by either the bandwidth of the PLL or a phase slope limiter dependent on the application.

Decay

Due to the limited accuracy of the frequency estimate and the phase build-out, the PLL likely needs to settle and pull in the remaining frequency and phase offset. The bandwidth and/or the damping of the PLL can be relaxed to speed up the remaining pull-in and shorten the settling time. Since the remaining frequency and phase offsets are quite small after the integrator ramp and phase correction, the requirements for relaxing the PLL bandwidth and/or damping are minimized, thereby reducing the degradation of the PLL's output clock. Note that the relaxed bandwidth and damping settings that would be used during the decay stage would still be too restrictive to be used for locking without the use of the integrator ramp.

If the bandwidth during the decay stage is chosen much wider than the final bandwidth required by the application, a reduction in multiple smaller steps of the bandwidth to the final bandwidth will prevent the PLL's output clock from experiencing larger phase transients. When the bandwidth changes to a much smaller value while the PLL hasn't completely settled yet or in the presence of phase noise on the reference input clock, the proportional term will suddenly decrease with the same factor. This change needs to be compensated for by the integrator value in order to keep the sum of the proportional value and the integrator value the same. However, it takes the integrator some time to catch up and in the mean time the output phase will move away. If the bandwidth is reduced in small steps and at the same time PLL is less damped, then the integrator catches up relatively quickly and the output phase movement remains limited. Once the PLL is settled at the current bandwidth, the bandwidth can be reduced again with a small step until the final bandwidth has been reached. At that point the damping must also be set to the value that is required by the application.

Figure 6:
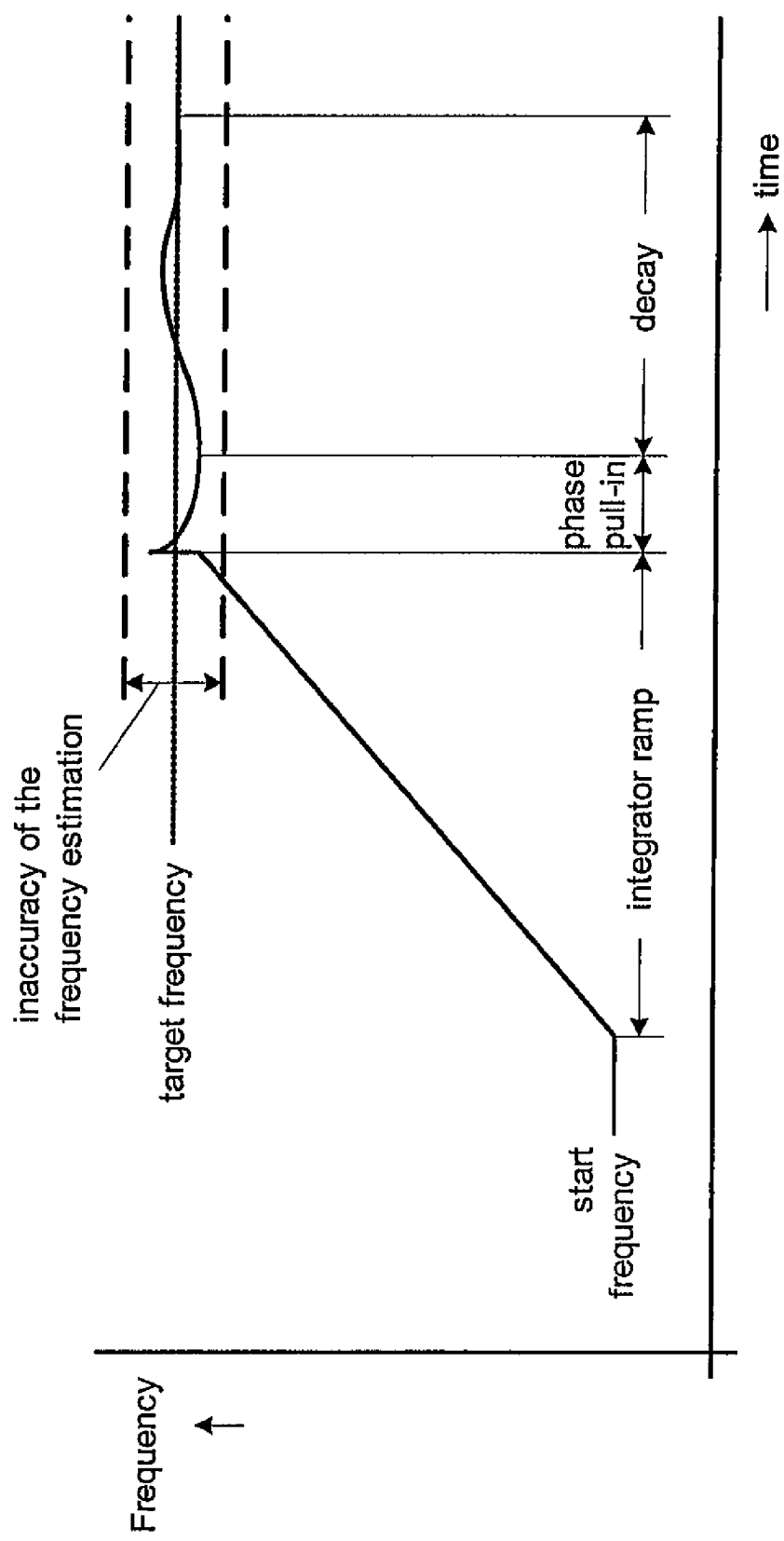
FIG. 6 illustrates the output clock frequency over time during the disclosed fast lock procedure.
Figure 7:
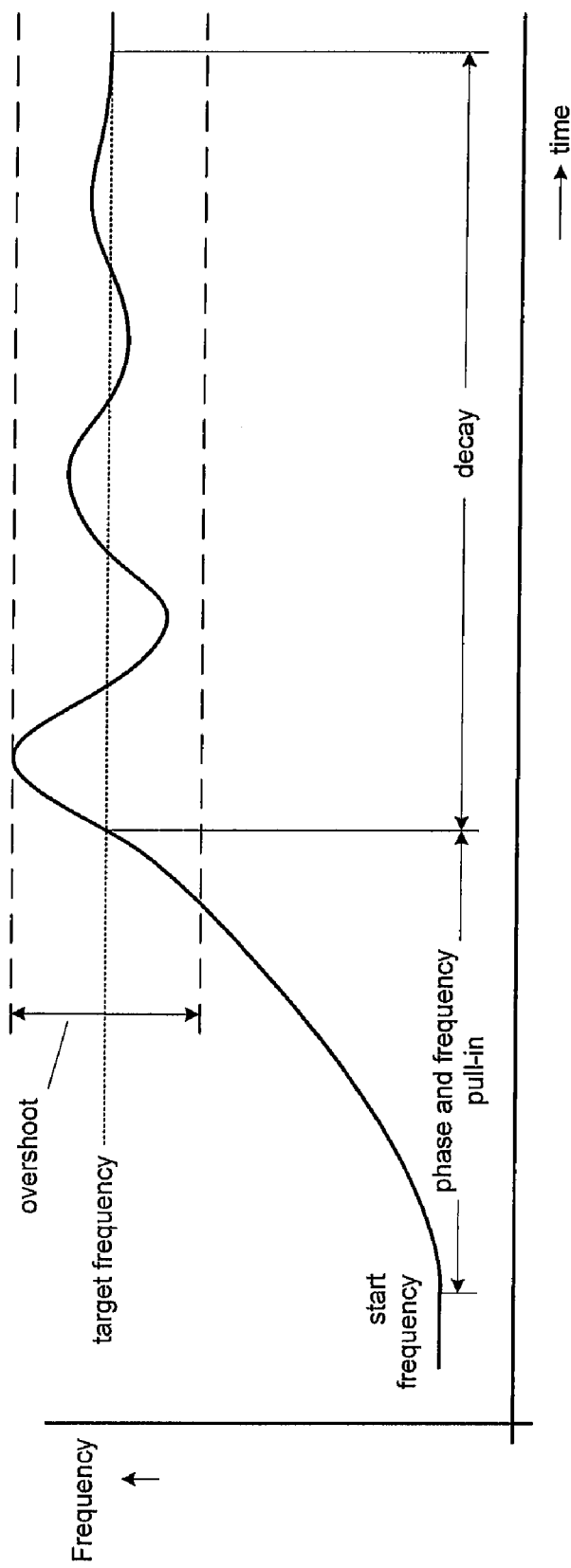
FIG. 7 illustrates the output clock frequency over time during settling for a prior art PLL.

In FIG. 6, it is seen that the overshoot is minimized compared to the response of FIG. 7 of a prior art PLL. It is clear that a PLL in accordance with the teachings of this invention settles much more quickly. For example, a SONET Minimum Clocks (SMC) compliant PLL that uses the method disclosed here can lock to a 40 ppm frequency offset in 45 s while a prior art PLL locks in 95 s under the same circumstances.

Numerous modifications may be made without departing from the spirit and scope of the invention as defined in the appended claims.

What is claimed is:

1. A method of locking a phase lock loop (PLL) after a lock lost is detected, comprising:
   estimating a new frequency offset using a circuit separate from the PLL;
   integrator ramping to the new frequency offset;
   adjusting the phase of the PLL based on the new frequency offset; and
   decaying the PLL to settle to the frequency jump.

2. The method of claim 1, wherein the step of estimating comprises using a separate PLL system that outputs the new frequency offset to the PLL.

3. The method of claim 1, wherein the step of estimating comprises using a local clock cycle counter counts the number of local clock cycles during a predetermined number of reference clock cycles.

4. The method of claim 1, wherein the step of adjusting comprises performing phase build out if a zero phase offset is not required, or performing a phase pull in if a zero phase is required.

5. The method of claim 4, wherein the step of performing a phase build out comprises:
   resetting a phase detector of the PLL;
   measuring a value of the shortest phase offset between an input of a reference clock and a PLL feedback clock;
   storing the value in a register; and
   subtracting the value from a phase value from the phase detector.

6. The method of claim 4, wherein the step of performing a phase pull in comprises disabling the integrator such that the integrator does not see a phase value from a phase detector of the PLL.

7. The method of claim 1, wherein the step of decaying comprises relaxing the bandwidth and/or damping of the PLL.

8. A method of locking a phase lock loop (PLL) after a lock lost is detected, comprising:

estimating a new frequency offset using a circuit separate from the PLL;

integrator ramping to the new frequency offset;

adjusting the phase of the PLL based on the new frequency offset by performing phase build out if a zero phase offset is not required, or performing a phase pull in if a zero phase is required; and decaying the PLL to settle to the frequency jump by relaxing the bandwidth and/or damping of the PLL.

9. The method of claim 8, wherein the step of estimating comprises using a separate PLL system that outputs the new frequency offset to the PLL.

10. The method of claim 8, wherein the step of estimating comprises using a local clock cycle counter counts the number of local clock cycles during a predetermined number of reference clock cycles.

11. The method of claim 8, wherein the step of performing a phase build out comprises:

resetting a phase detector of the PLL;

measuring a value of the shortest phase offset between an input of a reference clock and a PLL feedback clock;

storing the value in a register; and subtracting the value from a phase value from the phase detector.

12. The method of claim 8, wherein the step of performing a phase pull in comprises disabling the integrator such that the integrator does not see a phase value from a phase detector of the PLL.

13. A phase lock loop (PLL) capable of fast locking after a lock lost is detected, comprising:

a lock detector for detecting a lock lost of the PLL;

an input for receiving an estimated new frequency offset from using a circuit separate from the PLL after lock lost;

an integrator for ramping to the new frequency offset; and a phase adjuster for adjusting the phase of the PLL based on the new frequency offset by performing phase build out if a zero phase offset is not required, or performing a phase pull in if a zero phase is required and decaying the PLL to settle to the frequency jump by relaxing the bandwidth and/or damping of the PLL.

14. The PLL of claim 13, wherein the frequency estimator comprises a separate PLL system that outputs the new frequency offset to the PLL.

15. The PLL of claim 13, wherein the frequency estimator comprises a local clock cycle counter that counts the number of local clock cycles during a predetermined number of reference clock cycles.

16. The PLL of claim 13, wherein the phase build is performed using a register to store a value representing a value of the shortest phase offset between an input of a reference clock and a PLL feedback clock and the value from a phase value from the phase detector, after a phase detector of the PLL has been reset.

* * * * *

UNITED STATES PATENT AND TRADEMARK OFFICE
CERTIFICATE OF CORRECTION

PATENT NO. : 7,369,002 B2  Page 1 of 1
APPLICATION NO. : 11/460393
DATED : May 6, 2008
INVENTOR(S) : Spijker et al.

It is certified that error appears in the above-identified patent and that said Letters Patent is hereby corrected as shown below:

Title page, item [75] should read as follows:
Inventors: Menno Tjeerd Spijker, Ottawa (CA);
Jason Robert Rosinski, Ottawa (CA);
Robert Laurentius Van Der Valk, Capelle a/d IJssel (NL)

Signed and Sealed this

Fourteenth Day of October, 2008

JON W. DUDAS
*Director of the United States Patent and Trademark Office*